United States Patent [19]
Kodama

[11] Patent Number: 5,953,605
[45] Date of Patent: Sep. 14, 1999

[54] FABRICATION PROCESS OF SEMICONDUCTOR DEVICE

[75] Inventor: Noriyuki Kodama, Tokyo, Japan

[73] Assignee: NEC Corporation, Tokyo, Japan

[21] Appl. No.: 08/808,543

[22] Filed: Feb. 28, 1997

[51] Int. Cl.$^6$ .................................................. H01L 21/8238
[52] U.S. Cl. ...................... 438/231; 438/300; 438/564; 438/592
[58] Field of Search ................................ 438/300, 564, 438/592, 231

[56] References Cited

U.S. PATENT DOCUMENTS 5,079,180  1/1992  Rodder et al. .
5,168,072  12/1992  Moslehi .

FOREIGN PATENT DOCUMENTS 1-232768  9/1989  Japan .
1-293668  11/1989  Japan .
2-222153  9/1990  Japan .

OTHER PUBLICATIONS

Ghandhi, VSLI Fabrication Principles, John Wiley & Sons, p. 643 1983.

Primary Examiner—John F. Niebling
Assistant Examiner—Jonathan Hack
Attorney, Agent, or Firm—Foley & Lardner

[57] ABSTRACT

After forming an isolation layer and a well region on and in a silicon substrate, a gate oxide layer, a gate electrode of polycrystalline silicon and an oxide layer on the gate electrode are formed. Subsequently, a side wall of a nitride layer is formed. Then, the oxide layer on the gate electrode is removed. Next, selective growth of impurity doped silicon is performed at a temperature lower than or equal to 800° C. to form an elevated source-drain region in a source-drain region. Also, a polycrystalline silicon layer is formed on the gate electrode. Thereafter, by performing heat treatment, the impurity is diffused from the source-drain region to the surface of the silicon substrate to form a source-drain diffusion layer. Simultaneously, conductivity is provided to the entire gate electrode by diffusing impurity from the polycrystalline silicon layer to the gate electrode.

15 Claims, 5 Drawing Sheets

FABRICATION PROCESS OF SEMICONDUCTOR DEVICE

BACKGROUND OF THE INVENTION

1. Field of the Invention

The present invention relates generally to a fabrication process of a semiconductor device. More specifically, the invention relates to a fabrication process of a fine transistor having gate length less than or equal to 0.25 μm, for example.

2. Description of the Prior Art

For speeding-up and increasing of package density of MOS integrated circuit, down-sizing of transistor is essential. Down-sizing of the MOS transistor is generally performed according to a scaling rule. Gate length is restricted by exposure technology. In the current technology, an exposure device employing i-ray achieves 0.25 μm of gate length, and an electron beam exposure device achieves less than 0.1 μm of gate length. Associating with such down-sizing of the gate length, a technology has been required to reduce depth of a diffusion layer (junction depth) forming a source-drain region to be less than or equal to 0.1 μm. The depth of the diffusion layer is defined as a depth from the surface of a silicon substrate before being elevated to the point where an impurity concentration becomes equal to a concentration of a well region.

In a method for fabricating a semiconductor device employing an ion implantation method for forming a shallow diffusion layer, since ion has to be implanted at low speed, long period is required for implantation. Therefore, such method is not suitable for mass-production. On the other hand, when boron, as P-type impurity, is employed, enhanced diffusion is caused to widely spread impurity distribution during heat treatment. Therefore, it is difficult to restrict the depth of the diffusion layer to be less than or equal to 100 nm.

In order to solve these problems, a method for forming a source-drain layer and a gate electrode are formed in self-align manner without employing the ion implantation method, has been proposed in Japanese Unexamined Patent Publication No. Hei 1-293668. A fabrication process not employing the ion implantation will be discussed with reference to the accompanying drawing. FIG. 1 is a section of a semiconductor chip showing a fabrication process without employing the ion implantation method.

At first, on a surface of a silicon substrate 1A, a silicon oxide layer and an isolation layer 2 are formed. Then, on the silicon oxide layer, a silicon nitride layer is formed. Next, by etching for the silicon oxide layer to length consistent with gate length, a gate oxide layer 13 is formed. Etching is performed for the silicon nitride layer to make it narrower than the gate oxide layer 13 to form a silicon nitride layer 15. Subsequently, on a source-drain region, an elevated source-drain region 17 doped with impurity selectively is formed. In conjunction therewith, on the silicon nitride layer 15, a gate electrode 14 of a polycrystalline silicon layer doped with impurity is formed. Next, with taking the source-drain region 17 as a diffusing source, the impurity is diffused to form a source-drain diffusion layer 10.

At this time, as disclosed in Japanese Unexamined Patent Publication No. Hei 1-293668, it is possible that the region to form the source-drain layer is preliminarily oxidized by selective oxidation method or so forth and etched to make the region to form the gate oxide layer lower so as to prevent shorting of the elevated source-drain region 17 and the gate electrode 14.

With these methods, the impurity region is formed without performing the ion implantation method, semiconductor devices having shallow junction can be fabricated through mass-production. However, since a stacked layer of the oxide layer and the nitride layer is employed as the gate insulation layer, a gate capacity cannot be made smaller in the foregoing construction. Furthermore, the structure becomes complicate. Thus, it is difficult to realize such structure in fabrication of a fine transistor. Furthermore, a condition which assures selectivity of growth in growing of the silicon nitride layer and silicon oxide layer, for example, a process window of heat treatment temperature and gas flow rate becomes narrow.

On the other hand, in either case of employing or not employing the ion implantation method, when a diffusion layer is made shallow, sheet resistance becomes large. Furthermore, restriction in process becomes tighter, such as a period for over-etching cannot be made long enough upon opening of the contact hole by a plasma etching method. Also, contact resistance with the wiring becomes higher.

Then, in order to eliminate the sheet resistance, a method to form a titanium silicide on the diffusion layer is studied. However, when depth of the diffusion layer becomes less than or equal to 100 nm, formation of thin film silicide corresponding thereto becomes difficult.

As a method to solve such problems, a method for forming the elevated diffusion region by selectively forming the silicon layer on the diffusion layer, namely a fabrication process of the semiconductor device by a lifting-up method, has been proposed (Japanese Unexamined Patent Publication No. Hei 2-222153). This conventional fabrication process of the semiconductor device will be discussed with reference to the accompanying drawings. FIGS. 2A to 2C are sections of a semiconductor chip showing series of process steps in sequential order of the known fabrication process in order.

As shown in FIG. 2A, a fabrication process of an isolation layer, a gate oxide layer, a gate electrode and a side wall will be similar to those of a fabrication process of a normal transistor. Namely, at first, by selectively oxidizing the surface of a silicon substrate 1A, an isolation layer 2 is formed. Subsequently, impurity is doped in depth of several μm of the silicon substrate 1A by ion implantation to form a well region 1B. Next, after formation of an oxide layer over the entire surface in thickness of 5 nm, for example, a polycrystalline silicon layer to be the gate electrode, is deposited in thickness of 200 nm, for example. Also, after deposition of an oxide layer in thickness of 50 nm, for example, on the polycrystalline silicone layer, patterning is performed to form a gate oxide layer 3, a gate electrode 4A and an oxide layer 5A on the gate electrode 4A. Subsequently, after deposition of a nitride layer, the nitride layer is removed by plasma etching for the portion other than the portion on the side surface of the gate electrode to form a side wall 6A of the nitride layer.

Next, as shown in FIG. 2B, after removal of natural oxidation layer at the source-drain region by hydrofluoric acid vapor treatment of the surface of the silicon substrate 1A, the silicon substrate 1A is put into a low pressure CVD system without exposing to atmosphere. Then, performing hydrogen baking at about 800° C., the natural oxidation layer at the surface of silicon is completely removed. Then, epitaxial growth of silicon in thickness of about 50 to 70 nm is performed selectively in the region where the silicon surface is exposed, with taking silane ($SiH_4$) gas as a material gas with mixing a hydrogen chloride gas (HCl) at about 800° C. At this time, the reason of mixing of HCl in the gas is not to form a silicon layer on the silicon oxide layer. Then, with epitaxial growth, an elevated source-drain region 7A is formed. At this time, a portion 8 does not tightly fitted on the side wall (hereinafter referred to as facet 8) is formed in a portion contacting the source-drain layer 7A with the side wall 6A.

Next, as shown in FIG. 2C, for burying the facet 8, a side wall 6B is formed again of a nitride layer, for example. Then, after removing the oxide layer 5A on the gate electrode 4A, an oxide layer in thickness of 5 nm, for example, is formed on the gate electrode 4A as a layer for preventing contamination of ion implantation. Then, by ion implantation, for example, the elevated source-drain region 7A and the gate electrode 4A are doped with $BF_2$ at 10 to 20 keV in case of P-type impurity being to be doped, or arsenic at 40 to 60 keV in case of N-type impurity being to be doped. Then, through heat treatment, the impurity is activated. Through this process, the impurity in the gate electrode 4A is diffused over the entire electrode to provide conductivity by activation. In conjunction therewith, the impurity in the elevated source-drain region 7B, which is doped, is diffused in the direction of silicon substrate, to form the source-drain diffusion layer 10A at the surface of the substrate.

Next, after removing the screen oxide layer for contamination protection, a titanium layer is deposited in thickness of about 40 nm, for example, by sputtering. Then, a rapid thermal annealing (RTA) method is performed up to about 700° C., a titanium silicide ($TiSi_2$) layer with relatively high resistance is formed on the elevated source-drain region 7B and the gate electrode 4A. Next, substances other than titanium silicide, such as titanium nitride, excessive titanium and so forth, are removed by selective etching. Thereafter, rapid thermal annealing is performed up to about 850° C., resistance of the titanium silicide layer is lowered to form a low resistance titanium silicide layer 11A to complete the silicide forming process.

Then, an interlayer insulation layer is deposited by a plasma CVD method at low temperature. It is completed to fabricate a MOS transistor with forming a contact hole, an electrode and so forth.

On the other hand, with taking the gate as a mask, ion having the same conductivity type to the source-drain layer, is implanted in the extent of $1 \times 10^{13}$ atoms/cm$^3$ to lower resistance of the region of the lower portion of the side wall to form LDD (Lightly Doped Drain) structure.

In the method to perform ion implantation without employing a lifting up method, the impurity which is doped by ion implantation, diffuses in the direction of the substrate. Therefore, it is not possible to make the junction depth to be shallow to be less than or equal to 100 nm as a distance of diffusion of the impurity upon activation. On the other hand, when a semiconductor device is fabricated by a foregoing lifting up method, there is a margin for the impurity to diffuse in the extent corresponding to the elevated region thickness to easily make the depth of the diffusion layer shallow. Namely, if a lifting up method in magnitude of 50 nm is employed, even when the conventional ion implantation is performed, depth of the diffusion layer can be reduced to be about 50 nm. Thus, junction adapted to a fine device having the gate length less than or equal to 0.1 $\mu$m can be formed.

Also, if the substantially equal depth is provided in the case where the lifting-up method is employed and the case where the lifting-up method is not employed, the sheet resistance of the source-drain layer in the elevated portion can be lowered in the portion where the lifting-up method is employed. Furthermore, increasing of contact resistance can be prevented.

However, when fabrication of the semiconductor device is performed by the foregoing process, it is not suitable for mass-production since an ion implantation method is employed. In addition, when the layer thickness of the elevated source-drain region and facet configuration is varied within a wafer surface or among lots, such fluctuation can directly be reflected as the fluctuation of the depth of the diffusion layer. This problem is arisen since the depth of the diffusion layer becomes shallower in magnitude corresponding to the elevated region thickness from the distance of the diffusion of the impurity. When layer thickness of the second side wall is increased for avoiding the foregoing problem, another problem is arisen in increasing of resistance below the side wall.

Therefore, a method to reduce fluctuation of the depth of the diffusion layer is implemented. FIG. 3 is a section of the known semiconductor chip. As shown in FIG. 3, at first, on the silicon substrate 1A, similarly to the fabrication process shown in FIGS. 2A to 2C, an isolation layer 2, a gate oxide layer 3, a gate electrode 4A, an oxide layer 5A and side walls 6A to 6B are formed. Then, in a region reserved for formation of the diffusion layer, a selective epitaxial layer doped with impurity is formed as a source-drain region 17. With taking the source-drain region 17 as a diffusing impurity source, the impurity is diffused to form a source-drain diffusion layer 10 at the surface of the silicon substrate. With this process, the depth of the source-drain diffusion layer 10 can be uniform within the surface irrespective of the layer thickness of the elevated portion. Furthermore, since high concentration impurity can be doped in the elevated portion, the resistance in the source-drain layer can be reduced.

However, when the semiconductor device is fabricated in this process, it becomes necessary to perform the process for doping the impurity into the source-drain layer and the process for doping the impurity into the gate electrode in separate steps. The process with the separated steps is inconvenient.

On the other hand, in a fine transistor, by adjusting a threshold level of a P-type transistor to make the transistor into enhancement type, it becomes necessary to make the impurity in the gate electrode in high concentration. It this case, doping of the impurity into the source-drain region and doping of the impurity into the gate electrode can be done simultaneously by self-align method. However, when the gate electrode is P-type, boron may diffuse into the gate oxide layer during heat treatment to reach a channel region to fluctuate the threshold level of the transistor. On the other hand, when the gate electrode is N-type, unless the heat treatment is performed completely for the impurity difficult to diffuse, such as As, the impurity concentration becomes low at the side contacting with the gate oxide layer in the polycrystalline silicon layer forming the gate electrode. Therefore, this region can be depleted. As such, this method encounters various problems in view point of controllability of fabrication processes.

In the method to form the source-drain diffusion layer with the impurity diffusing from the elevated region doped with the impurity, if the gate electrode and the source-drain diffusion layer are formed simultaneously, it becomes necessary to separately dope the impurity into the gate electrode by an ion implantation method and so forth to prevent the depletion of the lower layer of the gate electrode. Therefore, setting of process condition becomes complicate.

SUMMARY OF THE INVENTION

It is an object of the present invention to provide a fabrication process of a semiconductor device with a source-drain layer of elevated structure, which can make depth (junction depth) of a diffusion layer to be shallow to be about 50 nm, and dope impurity into a gate electrode in self-align manner.

A fabrication process of a semiconductor device, according to the present invention, has a step of forming a gate insulation layer on a surface of a semiconductor substrate of one conductivity type. Then, a polycrystalline semiconductor layer and a first oxide layer having greater layer thickness than the gate insulation layer are sequentially deposited on a surface of the gate insulation layer. Thereafter, a gate electrode of the polycrystalline semiconductor layer and a second oxide layer covering the gate electrode are formed by patterning the polycrystalline semiconductor layer and the first oxide layer. A first side wall higher than the layer thickness of the gate electrode is formed on the side surface of the gate electrode by forming a nitride layer over the entire surface and subsequently etching it back. Then, the second oxide layer is removed. Thereafter, an elevated first source-drain region is formed in a source-drain region above the semiconductor substrate and a first polycrystalline semiconductor layer is formed on the gate electrode by depositing a semiconductor layer containing impurity of the other conductivity type over a region where the semiconductor substrate is exposed and the gate electrode. A source-drain diffusion layer is formed in the semiconductor substrate by performing heat treatment for diffusing the impurity from the first source-drain layer to the semiconductor substrate, and conductivity is provided for the gate electrode by the heat treatment, diffusing the impurity from the polycrystalline semiconductor layer to the gate electrode.

On the other hand, the semiconductor layer may be formed by a selective semiconductor growth layer method.

Also, the fabrication process of a semiconductor device may further comprise a step of forming a semiconductor alloy layer of refractory metal or transition metal on the source drain layer and the first polycrystalline semiconductor layer, after said heat treatment step.

A second polycrystalline semiconductor layer may be formed by selectively growing a semiconductor layer not doped with impurity on the first source-drain layer and the first polycrystalline semiconductor layer. Also, a semiconductor alloy layer of refractory metal or transition metal may be formed on the second polycrystalline semiconductor layer, between said semiconductor layer depositing step and said heat treatment step.

Also, a natural oxidation layer formed on the surface of the semiconductor oxide layer may be removed by treatment of the surface of the semiconductor with hydrofluoric acid vapor. Then, the natural oxidation layer may be completely removed by putting the semiconductor substrate into a CVD system without exposing to the ambient air and performing hydrogen baking at a temperature lower than or equal to 800° C., between said second oxide layer removing step and said semiconductor layer depositing step.

The CVD system may be one of a low pressure CVD system and an extreme high vacuum CVD system.

A second side wall may be formed on the side surface of the first side wall by forming a nitride layer over the entire surface and etching it back, after said heat treatment step.

Furthermore, patterning may be performed by applying a photoresist layer and exposing it.

On the other hand, the etching back may be performed by way of a plasma etching method.

Also, in said semiconductor layer depositing step, selective semiconductor growth may be performed employing a mixture gas consisted of diborane ($B_2H_5$) or arsine ($ASH_3$), silane ($SiH_4$) and hydrogen chloride (HCl).

The height of the first side wall may be higher than the first polycrystalline semiconductor layer.

On the other hand, in said heat treatment step, rapid thermal annealing may be performed to elevate temperature up to 900 to 1000° C. and maintain the temperature.

The refractory metal may be one kind of metal selected from a group consisted of titanium, cobalt and nickel.

In a fabrication process of a CMOS transistor, according to the present invention, at first, a first oxide layer is formed at a surface of a semiconductor substrate of one conductivity type. Then, the first oxide layer is patterned to form a well region of the other conductivity type semiconductor in the patterned region. Thereafter, a first gate insulation layer is formed on a surface of the well region. A first polycrystalline semiconductor layer and a second oxide layer having greater layer thickness than the first gate insulation layer are sequentially formed on a surface of the first gate insulation layer. Then, a first gate electrode and a third oxide layer covering the first gate electrode are formed by patterning the first polycrystalline semiconductor layer and the first oxide layer. Thereafter, a first side wall higher than the layer thickness of the first gate electrode is formed on a side surface of the first gate electrode by forming nitride layer over the entire surface and subsequently etching it back. The third oxide layer is removed. Then, a fourth oxide layer is formed over the entire surface. Thereafter, the well region is opened by patterning the fourth oxide layer. An elevated first source-drain region is formed in a source-drain region above the well region, and a first polycrystalline semiconductor layer on the first gate electrode by depositing a semiconductor layer containing impurity of one conductivity type on a region where the well region is exposed and the first gate electrode. Then, a second gate insulation layer is formed by patterning the fourth oxide layer. Thereafter, a second polycrystalline semiconductor layer and a fifth oxide layer having greater thickness than the second gate insulation layer are sequentially formed on the surface of the second gate insulation layer. A second gate electrode of the second polycrystalline semiconductor layer and a sixth oxide layer covering the second gate electrode are formed by patterning the second polycrystalline semiconductor layer and the fifth oxide layer. Then, a second side wall higher than the second gate electrode is formed on the side surface of the second gate electrode by forming a nitride layer over the entire surface and subsequently etching it back. Thereafter, the sixth oxide layer is removed. An elevated second source-drain region is formed in a source-drain region on the semiconductor substrate, and a third polycrystalline semiconductor layer is formed on the second gate electrode by depositing semiconductor layer containing the other conductivity type impurity on a region exposing the semiconductor substrate and the second gate electrode. Heat treatment is performed for forming a first source-drain diffusion layer in the well region and a second source-drain diffusion layer in the semiconductor substrate by diffusing impurity from the first and second source-drain layers to the well region and the semiconductor substrate, respectively, and for providing conductivity for the first and second gate electrode by diffusing impurity from the first and second polycrystalline semiconductor layers to the first and second gate electrodes, respectively.

In the present invention, since a silicon layer selectively doped with impurity is formed on the source-drain region and the gate electrode, the source-drain diffusion layer is formed and conductivity is provided for the gate electrode by diffusing impurity into the silicon substrate and the gate electrode with taking the silicon layer as the diffusing impurity source. Therefore, a fine MOS transistor with quite shallow junction can be fabricated. Also, by making impurity concentration in the portion to be consumed by the silicide in the source-drain region lower than concentration of the portion contacting with the silicon substrate, silicide layer thickness of an N-type transistor can be thicker to be comparable with silicide layer of a P-type transistor.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
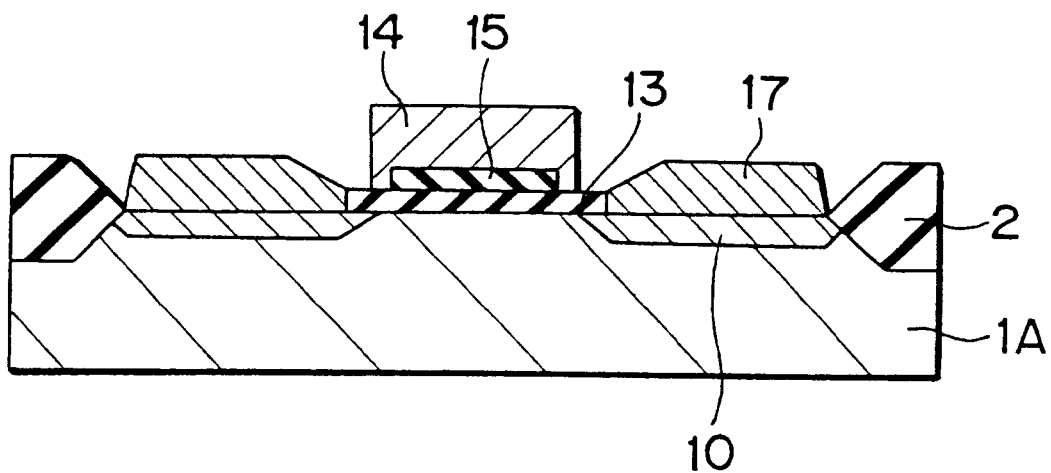
FIG. 1 is a section of a semiconductor chip showing a process of the conventional fabrication process of a semiconductor device.
Figure 2A:
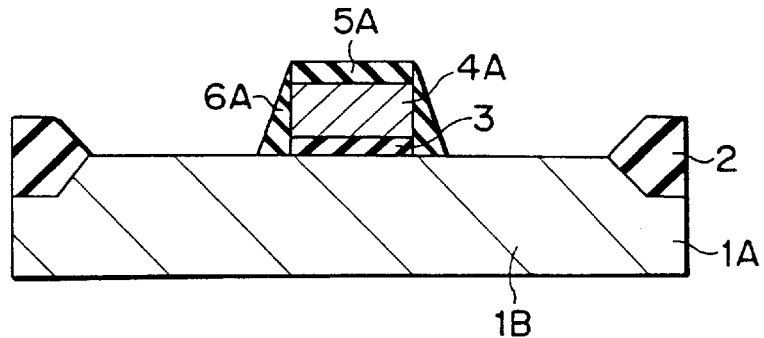
FIGS. 2A to 2C are sections showing a series of steps in sequential order of another conventional fabrication process of the semiconductor device.
Figure 2B:
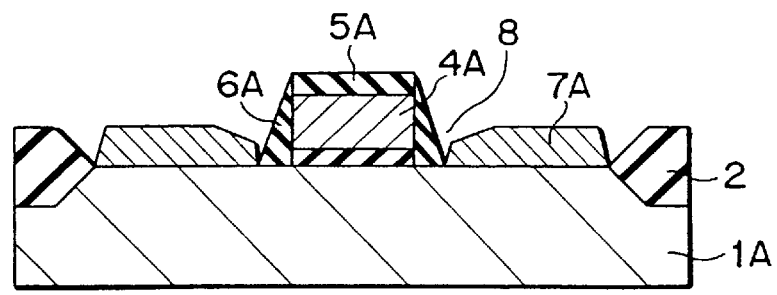
Figure 2C:
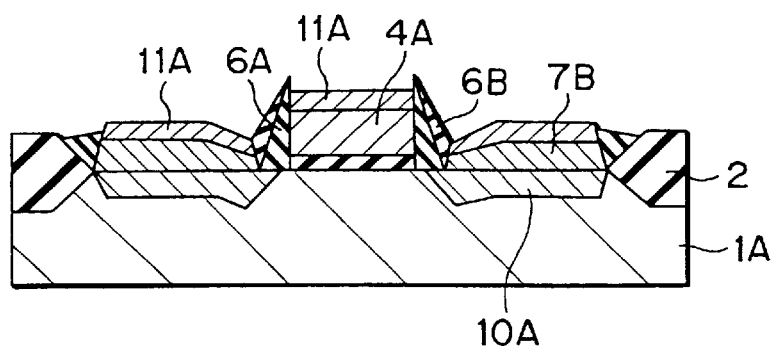
Figure 3:
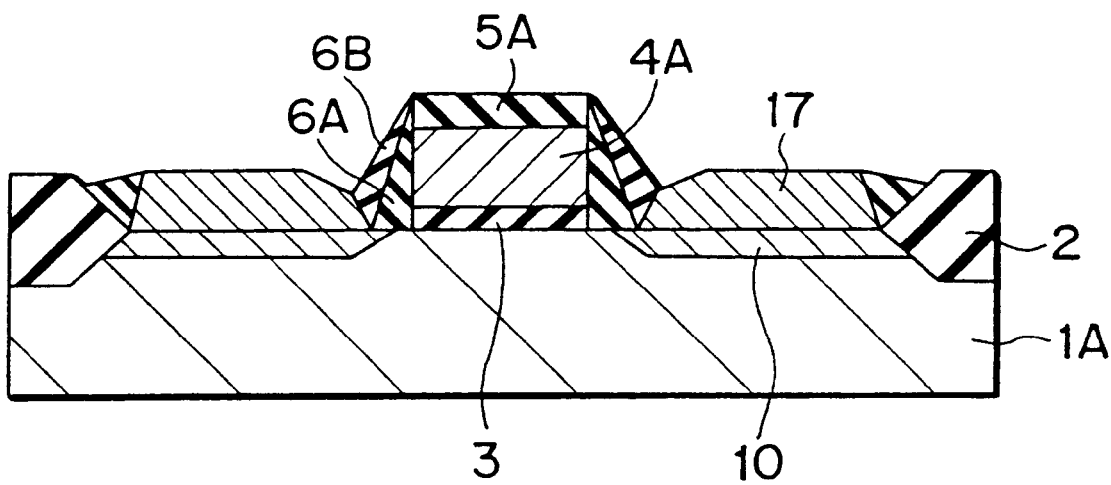
FIG. 3 is a section of a semiconductor chip showing a further conventional fabrication process of the semiconductor device.
Figure 4A:
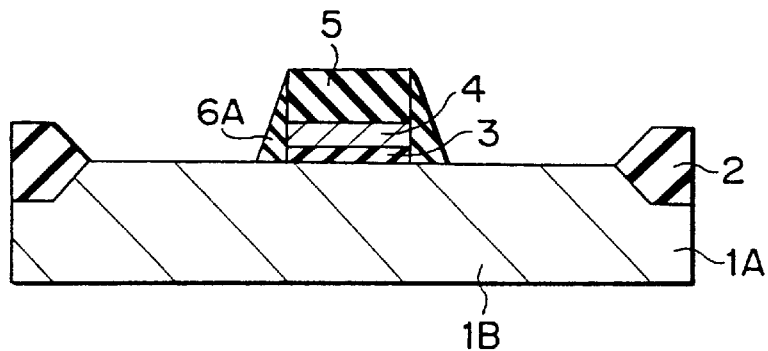
FIGS. 4A to 4C are sections showing a series of steps in sequential order of the first embodiment of a fabrication process of a semiconductor device according to the present invention.
Figure 4B:
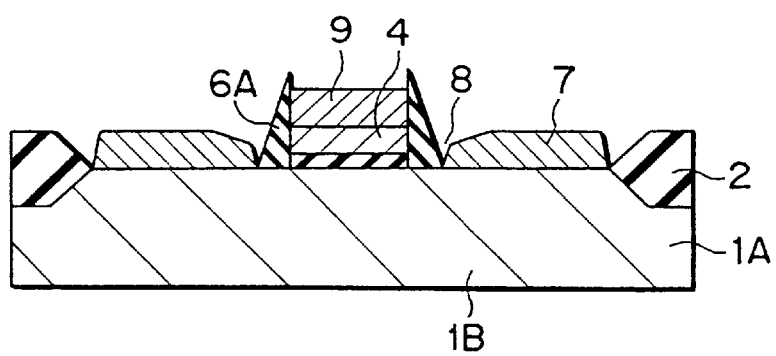
Figure 4C:
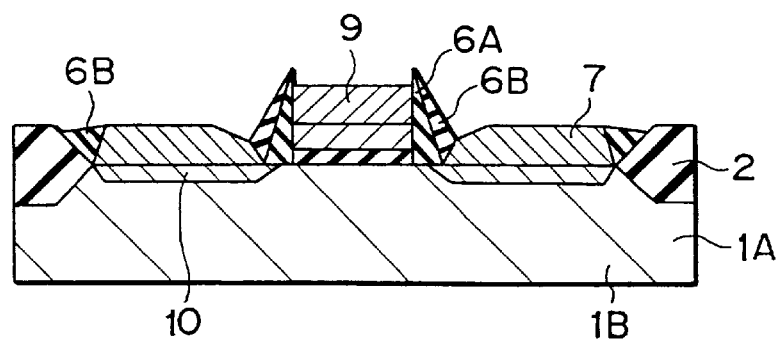

FIGS. 4A to 4C are sections showing a series of process steps in sequential order of the first embodiment of a fabrication process of a semiconductor device according to the present invention.

At first, as shown in FIG. 4A, similarly to the prior art, a surface of a silicon substrate 1A is selectively oxidized to form an isolation layer 2. Next, by ion implantation, a well region 1B is formed. After formation of a gate oxide which has a thickness of 5 nm, for example, a polycrystalline silicon layer having thickness of 50 nm and an upper oxide layer having thickness of 100 nm, for example, are deposited in series of order over the entire surface. Subsequently, a photoresist layer is applied and exposed to form a mask for a gate electrode pattern. Then, by way of a plasma etching method, the upper oxide layer and the polycrystalline silicon layer are etched to form a gate electrode 4 and an upper oxide layer 5. Thereafter, the photoresist layer is removed. Then, a nitride layer having thickness of 20 nm, for example, is deposited, and subsequently etched back to form a side wall 6A of the nitride layer.

Thereafter, as shown in FIG. 4B, the upper oxide layer 5 is removed. Next, a surface of the silicon substrate is processed by hydrofluoric acid vapor treatment to remove a natural oxidation layer, and then is put into a low pressure CVD system without exposing to the ambient air. Then, hydrogen baking is performed at low temperature lower than or equal to 800° C. to completely remove the natural oxidation layer. Thereafter, employing $SiH_4$ as a material gas, HCl is mixed for performing selective growth. Furthermore, in case of fabrication of a P-type transistor, diborane ($B_2H_5$) is mixed, and in case of fabrication of a N-type transistor, arsine ($AsH_3$) is mixed. Then selective silicon growth is performed at temperature lower than or equal to 800° C. with doping $1 \times 10^{20}$ atoms/cm$^3$ of boron or arsenic. At this time, in a source-drain region, an elevated source-drain region 7 of an epitaxial layer having thickness of 100 nm, for example, is formed. In conjunction therewith, on the gate electrode 4, a polycrystalline silicon layer 9 having substantially the same layer thickness is formed. At this time, facet 8 can be caused at the portion where the source-drain layer and the side wall 6A contact to each other. During the selective growth of silicon, in order to prevent the polycrystalline silicon layer 9 growing on the gate electrode from growing in lateral direction to contact with the source-drain region, the height of the side wall 6A is set to be higher than the layer thickness of the polycrystalline silicon layer 9.

Next, as shown in FIG. 4C, diffusion and activation of impurity are performed to form a source-drain diffusion layer 10. At this time, when boron is used as impurity, rapid thermal annealing is performed up to 900° C. for heat treatment for several tens seconds. Thus, boron in the source-drain region 7 is diffused toward the silicon substrate in extent of 50 to 80 nm, for example, and the source-drain diffusion layer 10 is formed. At this time, impurity is also diffused into the gate electrode 4 at the lower layer of the doped polycrystalline silicon layer 9 forming the gate electrode for activation to provide conductivity for the entire gate electrode. When an N-type diffusion layer is to be formed, rapid thermal annealing is performed up to 1000° C. to perform heat treatment for diffusing impurity. Subsequently, a side wall 6B is formed to bury the facet 8. Then, the elevated source-drain region 7 and the upper portion of the gate electrode are converted into silicide to form the interlayer insulation layer, electrode and so forth to complete fabrication of the MOS transistor.

With the first embodiment set forth above, since formation of junction is performed by solid phase diffusion with taking the elevated source-drain region as diffusing impurity source, the depth of the diffusion layer can be made shallow in the extent of 50 nm irrespective of the facet configuration and layer thickness of the elevated region, with high stability.

On the other hand, with the first embodiment, layer resistance and contact resistance can be held low. Also, doping of impurity to the source-drain region and the gate electrode can be performed simultaneously in self-align manner. Furthermore, concerning doping of impurity into the gate electrode, by forming the gate electrode 4 of the polycrystalline silicon in the dimension to diffuse the impurity, going through of boron in the P-type transistor and depletion in the gate of the P-type and N-type transistor can be prevented with high controllability.

Fabrication of CMOS integrated circuit can be performed in the following manner. After forming the side wall 6A, the upper oxide layer 5 on the gate electrode is removed. Next, an oxide layer having a thickness of 50 nm is deposited over the entire surface. Then, through application of a photoresist layer and exposure thereof, only a region to form the N-type transistor is opened. After removal of the oxide layer, the resist layer is peeled off to perform selective silicon growth to form only the N-type transistor. Then, to form the region for the P-type transistor, the oxide layer is deposited again to perform the similar process to the shown embodiment.

It should be noted that combination of material of the side wall, material of the layer to be deposited on the gate polycrystalline silicon and selective etching method should not be specified to the combination of the silicon nitride layer, the oxide layer and the hydrofluoric acid treatment in the shown embodiment. Any combination which permits selective etching and can leave only side wall may be equally applicable.

Also, formation method of the selective silicon layer is not specified to the low pressure CVD method as in the shown embodiment. For example, a UHV-CVD method (ultra-high-vacuum CVD) maybe equally applicable. Furthermore, it is not essential that the source-drain layer is epitaxial layer as long as the layer can be formed selectively on the silicon. Also, it is important to remove a residual oxide layer, carbon, fluorine and so forth in the interface between the silicon substrate and the elevated source-drain region, since those should interfere diffusion of impurity from the diffusing impurity source to the silicon substrate and to the gate electrode to be a cause of junction leakage.

Next, the second embodiment of the fabrication process of the semiconductor device will be discussed with reference to the accompanying drawings, particularly to FIGS. 5A to 5B which are sections illustrating a series of process steps in sequential order of the second embodiment of the fabrication process of the semiconductor device according to the invention.

Figure 5A:
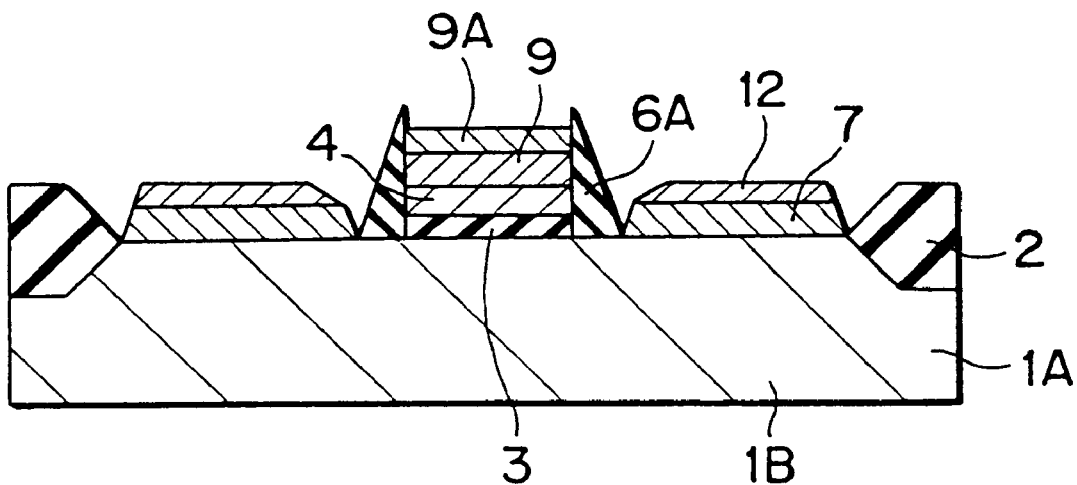
FIGS. 5A to 5B are sections showing a series of steps in sequential order of the second embodiment of a fabrication process of a semiconductor device according to the present invention.

At first, as shown in FIG. 5A, through the similar operation to those in the first embodiment, a well region 1B, an isolation layer 2, a gate oxide layer, a gate electrode 4 of polycrystalline silicon layer having a thickness of 50 nm, for example, and a side wall 6A are formed in or on a silicon substrate 1A. Thereafter, an oxide layer on the gate electrode 4 is removed. Thereafter, a surface of the silicon substrate is treated with hydrofluoric acid vapor to remove a natural oxidation layer. Then, without exposing to the ambient air, the silicon substrate is put into a low pressure CVD system to perform hydrogen baking at about 800° C. to completely remove the natural oxidation layer. Then, with employing SiH$_4$ as a material gas, adding HCl for performing selective growth, and further adding AsH$_3$, an arsenic doped source-drain region 7 and an arsenic doped polycrystalline silicon layer 9 are selectively formed in thickness of 40 nm, for example, on the source-drain region and the gate electrode 4, respectively. Thereafter, with terminating addition of AsH$_3$, a non-doped silicon layer 12 and a non-doped polycrystalline silicon layer 9A are formed on the arsenic doped source-drain region 7 and the polycrystalline silicon layer 9, respectively.

Figure 5B:
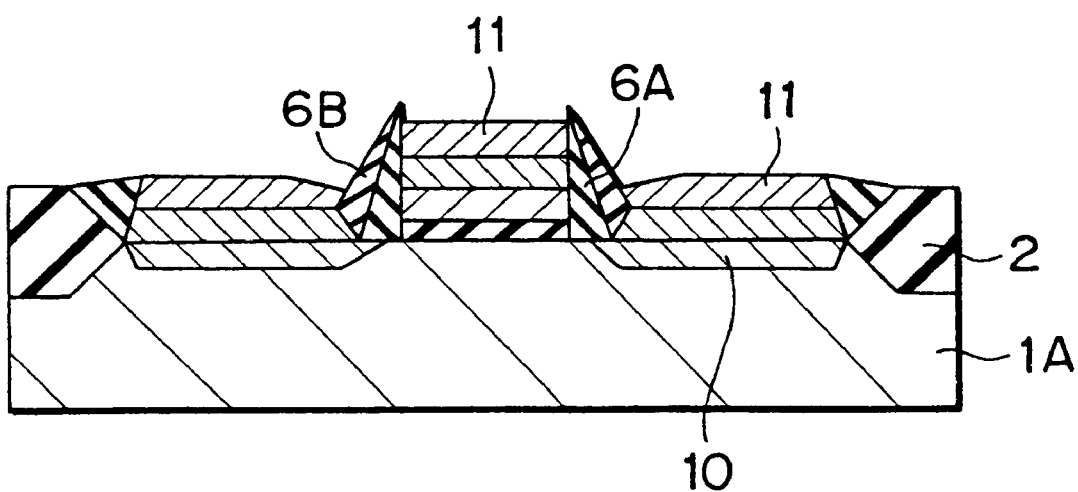

Next, as shown in FIG. 5B, the side wall 6B is formed to bury a facet. Then, arsenic is diffused toward the substrate at about 850° C. to form a source-drain diffusion layer 10. Subsequently, sputtering of titanium is performed over the entire surface for formation of silicide with consuming the non-doped silicon layer 12 and the polycrystalline silicon layer 9A in formation of silicide. Thus, a low resistance titanium silicide layer 11 is formed. Then, depositing an interlayer insulation layer, opening a contact hole, forming a wiring and so forth, a transistor is formed.

In the conventional method to form silicide by sputtering titanium on the source-drain region doped with N-type impurity, the impurity acts to prevent reaction of formation of silicide. Therefore, in case of the N-type transistor, a silicide layer was thinner than that in the P-type transistor. However, according to the second embodiment of the fabrication process, since the impurity is not doped in the silicon region at the surface side of the source-drain region, the layer thickness of the silicide region in the N-type transistor can be comparable with that in the P-type transistor.

It should be noted that the silicon alloy layer in the source-drain region should not be specified to titanium, but can be refractory metal, such as cobalt, nickel or so forth.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process of a semiconductor device comprising the steps of:

forming a gate insulation layer on a surface of a semiconductor substrate of one conductivity type;

sequentially depositing a polycrystalline semiconductor layer and a first oxide layer having greater layer thickness than said gate insulation layer, on a surface of said gate insulation layer;

forming a gate electrode of said polycrystalline semiconductor layer and a patterned oxide layer covering said gate electrode by patterning said polycrystalline semiconductor layer and said first oxide layer;

forming a first side wall higher than the layer thickness of said gate electrode, on the side surface of said gate electrode by forming a nitride layer over the entire surface and subsequently etching back said nitride layer after said step of forming a gate electrode;

removing said patterned oxide layer;

forming an elevated first source-drain region in a source-drain region above said semiconductor substrate and forming a first polycrystalline semiconductor layer on said gate electrode by depositing a semiconductor layer containing impurity of the other conductivity type over a region where said semiconductor substrate is exposed and over said gate electrode; and forming a source-drain diffusion layer in said semiconductor substrate by performing heat treatment for diffusing said impurity from said first source-drain region to said semiconductor substrate, and providing conductivity for said gate electrode by said heat treatment, diffusing said impurity from said first polycrystalline semiconductor layer to said gate electrode.

2. A fabrication process of a semiconductor device as set forth in claim 1, wherein said depositing a semiconductor layer containing impurity utilizes a selective semiconductor layer growth method.

3. A fabrication process of a semiconductor device as set forth in claim 1, comprising a step of forming a semiconductor alloy layer of refractory metal or transition metal on said source drain layer and said first polycrystalline semiconductor layer, after said step of forming a source-drain diffusion layer.

4. A fabrication process of a semiconductor device comprising the steps of:

forming a gate insulation layer on a surface of a semiconductor substrate of one conductivity type;

sequentially depositing a polycrystalline semiconductor layer and a first oxide layer having greater layer thickness than said gate insulation layer, on a surface of said gate insulation layer;

forming a gate electrode of said polycrystalline semiconductor layer and a patterned oxide layer covering said gate electrode by patterning said polycrystalline semiconductor layer and said first oxide layer;

forming a first side wall higher than the layer thickness of said gate electrode, on the side surface of said gate electrode by forming a nitride layer over the entire surface and subsequently etching back said nitride layer after said step of forming a gate electrode;

removing said patterned oxide layer;

forming an elevated first source-drain region in a source-drain region above said semiconductor substrate and forming a first polycrystalline semiconductor layer on said gate electrode by depositing a semiconductor layer containing impurity of the other conductivity type over a region where said semiconductor substrate is exposed and over said gate electrode;

forming a second polycrystalline semiconductor layer by selectively growing a semiconductor layer not doped with impurity on said first source-drain region and said first polycrystalline semiconductor layer;

forming a semiconductor alloy layer of refractory metal or transition metal on said second polycrystalline semiconductor layer, before said step of forming a source-drain diffusion layer; and forming a source-drain diffusion layer in said semiconductor substrate by performing heat treatment for diffusing said impurity from said first source-drain region to said semiconductor substrate, and providing conductivity for said gate electrode by said heat treatment, diffusing said impurity from said first polycrystalline semiconductor layer to said gate electrode.

5. A fabrication process of a semiconductor device as set forth in claim 1, comprising the steps of:

removing a natural oxidation layer formed on the surface of said semiconductor substrate by treatment of the surface of said semiconductor with hydrofluoric acid vapor, and completely removing said natural oxidation layer by putting said semiconductor substrate into a CVD system without exposing to the ambient air and performing hydrogen baking at a temperature lower than or equal to 800° C.

6. A fabrication process of a semiconductor device as set forth in claim 5, wherein said CVD system is one of a low pressure CVD system and an extreme high vacuum CVD system.

7. A fabrication process of a semiconductor device as set forth in claim 1, comprising:

step of forming a second side wall on the side surface of said first side wall by forming a nitride layer over the entire surface and etching back said nitride layer, after said step of forming a source-drain diffusion layer.

8. A fabrication process of a semiconductor device as set forth in claim 1, wherein said patterning is performed by applying a photoresist layer and performing exposure.

9. A fabrication process of a semiconductor device as set forth in claim 1, wherein said etching back is performed by way of a plasma etching method.

10. A fabrication process of a semiconductor device as set forth in claim 1, wherein in said step of forming an elevated first source-drain region, selective semiconductor growth is performed employing a mixture gas consisted of diborane ($B_2H_5$) or arsine ($AsH_3$), silane ($SiH_4$) and hydrogen chloride (HCl).

11. A fabrication process of a semiconductor device as set forth in claim 1, wherein the height of said first side wall is higher than said first polycrystalline semiconductor layer.

12. A fabrication process of a semiconductor device as set forth in claim 1, wherein, in said step of forming a source-drain diffusion layer, rapid thermal annealing is performed to elevate temperature up to 900 to 1000° C. and maintain the temperature until said impurity is sufficiently diffused.

13. A fabrication process of a semiconductor device as set forth in claim 3, wherein said refractory metal is a metal selected from a group consisted of titanium, cobalt and nickel.

14. A fabrication process of a semiconductor device comprising the steps of:

forming a gate insulation layer on a surface of a semiconductor substrate of one conductivity type;

sequentially depositing a polycrystalline semiconductor layer and a first oxide layer having greater layer thickness than said gate insulation layer, on a surface of said gate insulation layer;

forming a gate electrode of said polycrystalline semiconductor layer and a patterned oxide layer covering said gate electrode by patterning said polycrystalline semiconductor layer and said first oxide layer;

forming a first side wall higher than the layer thickness of said gate electrode, on the side surface of said gate electrode by forming a nitride layer over the entire surface and subsequently etching back said nitride layer after said step of forming a gate electrode;

removing said patterned oxide layer;

forming an elevated first source-drain region in a source-drain region above said semiconductor substrate and forming a first polycrystalline semiconductor layer on said gate electrode by depositing a semiconductor layer containing impurity of the other conductivity type over a region where said semiconductor substrate is exposed and over said gate electrode;

forming a second polycrystalline semiconductor layer by selectively growing a semiconductor layer not doped with impurity on said first source-drain region and said first polycrystalline semiconductor layer;

forming a semiconductor alloy layer of refractory metal or transition metal on said second polycrystalline semiconductor layer, before said step of forming a source-drain diffusion layer, wherein said refractory metal is a metal selected from a group consisting of titanium, cobalt and nickel; and forming a source-drain diffusion layer in said semiconductor substrate by performing heat treatment for diffusing said impurity from said first source-drain region to said semiconductor substrate, and providing conductivity for said gate electrode by said heat treatment, diffusing said impurity from said first polycrystalline semiconductor layer to said gate electrode.

15. A fabrication process of a CMOS transistor comprising the steps of:

forming a first oxide layer at a surface of a semiconductor substrate of one conductivity type;

patterning said first oxide layer and forming a well region of the other conductivity type semiconductor in said patterned region;

forming a first gate insulation layer on a surface of said well region;

sequentially depositing a first polycrystalline semiconductor layer and a second oxide layer having greater layer thickness than said first gate insulation layer on a surface of said first gate insulation layer;

forming a first gate electrode and a first patterned oxide layer covering said first gate electrode by patterning said first polycrystalline semiconductor layer and said first oxide layer;

forming a first side wall having a height higher than the layer thickness of said first gate electrode, on a side surface of said first gate electrode by forming nitride layer over the entire surface and subsequently etching back said nitride layer;

removing said first patterned oxide layer;

forming a fourth oxide layer over the entire surface, after said step of removing said first patterned oxide layer;

opening said well region by patterning said fourth oxide layer;

forming an elevated first source-drain region in a source-drain region in said well region, and a first polycrystalline semiconductor layer on said first gate electrode by depositing a semiconductor layer containing impurity of one conductivity type on a region where said well region is exposed and said first gate electrode;

forming a second gate insulation layer by patterning said fourth oxide layer;

sequentially forming a second polycrystalline semiconductor layer and a fifth oxide layer having greater thickness than said second gate insulation layer on the surface of said second gate insulation layer;

forming a second gate electrode of said second polycrystalline semiconductor layer and a second patterned oxide layer covering said second gate electrode by patterning said second polycrystalline semiconductor layer and said fifth oxide layer;

forming a second side wall higher than said second gate electrode on the side surface of said second gate electrode by forming a nitride layer over the entire surface and subsequently etching back said nitride layer, after said step of forming a second gate electrode;

removing said second patterned oxide layer;

forming an elevated second source-drain region in a source-drain region on said semiconductor substrate, and a third polycrystalline semiconductor layer on said second gate electrode by depositing semiconductor layer containing the other conductivity type impurity on a region exposing said semiconductor substrate and said second gate electrode; and performing heat treatment for forming a first source-drain diffusion layer in said well region and a second source-drain diffusion layer in said semiconductor substrate by diffusing impurity from said first and second source-drain regions to said well region and said semiconductor substrate, respectively, and for providing conductivity for said first and second gate electrode by diffusing impurity from said first and second polycrystalline semiconductor layers to said first and second gate electrodes, respectively.

* * * * *